(12) United States Patent
 Twieg

(10) Patent No.: US 11,415,651 B2
(45) Date of Patent: Aug. 16, 2022

(54) LOW NOISE GRADIENT AMPLIFICATION COMPONENTS FOR MR SYSTEMS

(71) Applicant: Hyperfine Operations, Inc., Guilford, CT (US)

(72) Inventor: Michael Twieg, New Haven, CT (US)

(73) Assignee: Hyperfine Operations, Inc., Guilford, CT (US)

( * ) Notice: Subject to any disclaimer, the term of this patent is extended or adjusted under 35 U.S.C. 154(b) by 40 days.

(21) Appl. No.: 17/116,510

(22) Filed: Dec. 9, 2020

(65) Prior Publication Data

US 2021/0173028 A1     Jun. 10, 2021

Related U.S. Application Data

(60) Provisional application No. 62/946,071, filed on Dec. 10, 2019.

(51) Int. Cl.
 *G01R 33/385* (2006.01)
 *H02M 5/293* (2006.01)

(52) U.S. Cl.
 CPC ........ *G01R 33/3852* (2013.01); *H02M 5/293* (2013.01)

(58) Field of Classification Search
 None
 See application file for complete search history.

(56) References Cited

U.S. PATENT DOCUMENTS

| | | |
|---|---|---|
| 5,270,657 A | 12/1993 | Wirth et al. |
| 9,541,616 B2 | 1/2017 | Rothberg et al. |
| 9,547,057 B2 | 1/2017 | Rearick et al. |
| 9,625,544 B2 | 4/2017 | Poole et al. |
| 9,645,210 B2 | 5/2017 | McNulty et al. |
| 9,817,093 B2 | 11/2017 | Rothberg et al. |
| 10,145,913 B2 | 12/2018 | Hugon et al. |
| 10,145,922 B2 | 12/2018 | Rothberg et al. |
| 10,222,434 B2 | 3/2019 | Poole et al. |
| 10,274,561 B2 | 4/2019 | Poole et al. |
| 10,281,540 B2 | 5/2019 | Mileski et al. |
| 10,281,541 B2 | 5/2019 | Poole et al. |
| 10,310,037 B2 | 6/2019 | McNulty et al. |
| 10,416,264 B2 | 9/2019 | Sofka et al. |
| 10,551,452 B2 | 2/2020 | Rearick et al. |

(Continued)

*Primary Examiner* — Rodney E Fuller
(74) *Attorney, Agent, or Firm* — Wolf, Greenfield & Sacks, P.C.

(57) ABSTRACT

Described herein are power components that may facilitate efficient, low noise operation of low-field MRI systems. In some embodiments, the power components may include switching power converters configured to switch in a manner that reduces or eliminates noise within a desired frequency band (e.g., the Larmor frequency band) due to harmonics of the switching frequency. For example, the desired frequency band may be positioned between adjacent integer harmonics of the switching frequency. In some embodiments, harmonic components generated by multiple switching power converters may destructively interfere with one another, reducing or eliminating the amplitude of the harmonic components of the switching frequency that reside in the desired frequency band. In some embodiments, the power components may include switching power converters configured in parallel without the need for active current balancing circuitry.

22 Claims, 14 Drawing Sheets

(56) References Cited

U.S. PATENT DOCUMENTS

| | | |
|---|---|---|
| 10,591,561 B2 | 3/2020 | Sacolick et al. |
| 10,709,387 B2 | 7/2020 | Poole et al. |
| 2015/0137810 A1 | 5/2015 | Ham et al. |
| 2016/0128592 A1 | 5/2016 | Rosen et al. |
| 2016/0299203 A1* | 10/2016 | Mileski .................. G05F 1/461 |
| 2019/0324098 A1 | 10/2019 | McNulty et al. |
| 2019/0353723 A1 | 11/2019 | Dyvorne et al. |
| 2019/0353726 A1 | 11/2019 | Poole et al. |
| 2020/0022611 A1 | 1/2020 | Nelson et al. |
| 2020/0022612 A1 | 1/2020 | McNulty et al. |
| 2020/0034998 A1 | 1/2020 | Schlemper et al. |
| 2020/0041588 A1 | 2/2020 | O'Halloran et al. |
| 2020/0045112 A1 | 2/2020 | Sacolick et al. |
| 2020/0058106 A1 | 2/2020 | Lazarus et al. |
| 2020/0200844 A1 | 6/2020 | Boskamp et al. |
| 2020/0209334 A1 | 7/2020 | O'Halloran et al. |
| 2020/0289019 A1 | 9/2020 | Schlemper et al. |
| 2020/0289022 A1 | 9/2020 | Coumans et al. |
| 2020/0294229 A1 | 9/2020 | Schlemper et al. |
| 2020/0294282 A1 | 9/2020 | Schlemper et al. |
| 2020/0294287 A1 | 9/2020 | Schlemper et al. |
| 2020/0337587 A1 | 10/2020 | Sacolick et al. |
| 2020/0355765 A1 | 11/2020 | Chen et al. |
| 2021/0048498 A1 | 2/2021 | Dyvorne et al. |

\* cited by examiner

LOW NOISE GRADIENT AMPLIFICATION COMPONENTS FOR MR SYSTEMS

CROSS-REFERENCE TO RELATED APPLICATIONS

This application claims priority under 35 U.S.C. § 119 to U.S. Provisional Patent Application Ser. No. 62/946,071, filed Dec. 10, 2019, titled LOW NOISE GRADIENT AMPLIFICATION COMPONENTS FOR MR SYSTEMS, which is hereby incorporated by reference in its entirety.

FIELD OF THE DISCLOSURE

This disclosure relates generally to power components for magnetic coils and, more particularly, to power components for driving one or more gradient coils in a magnetic resonance imaging system.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

MRI provides an attractive imaging modality for biological imaging due to the ability to produce non-invasive images having relatively high resolution and contrast without the safety concerns of other modalities (e.g., without needing to expose the subject to ionizing radiation, e.g., x-rays, or introducing radioactive material to the body). Additionally, MRI is particularly well suited to provide soft tissue contrast, which can be exploited to image subject matter that other imaging modalities are incapable of satisfactorily imaging. Moreover, MR techniques are capable of capturing information about structures and/or biological processes that other modalities are incapable of acquiring. However, there are a number of drawbacks to MRI that, for a given imaging application, may involve the relatively high cost of the equipment, limited availability and/or difficulty in gaining access to clinical MRI scanners and/or the length of the image acquisition process.

The trend in clinical MRI has been to increase the field strength of MRI scanners to improve one or more of scan time, image resolution, and image contrast, which, in turn, continues to drive up costs. The vast majority of installed MRI scanners operate at 1.5 or 3 tesla (T), which refers to the field strength of the main magnetic field $B_0$. A rough cost estimate for a clinical MRI scanner is on the order of one million dollars per tesla, which does not factor in the substantial operation, service, and maintenance costs involved in operating such MRI scanners.

Additionally, conventional high-field MRI systems typically require large superconducting magnets and associated electronics to generate a strong uniform static magnetic field ($B_0$) in which an object (e.g., a patient) is imaged. The size of such systems is considerable, with a typical MRI installment including multiple rooms for the magnet, electronics, thermal management system, and control console areas. The size and expense of MRI systems generally limits their usage to facilities, such as hospitals and academic research centers, which have sufficient space and resources to purchase and maintain them. The high cost and substantial space requirements of high-field MRI systems results in limited availability of MRI scanners. As such, there are frequently clinical situations in which an MRI scan would be beneficial, but due to one or more of the limitations discussed above, is not practical or is impossible, as discussed in further detail below.

SUMMARY OF THE DISCLOSURE

Some embodiments relate to an apparatus for providing power to operate at least one gradient coil of a magnetic resonance imaging system, the apparatus comprising: at least one switching power converter configured to provide, to the at least one gradient coil, an output signal having a characteristic frequency, wherein a Larmor frequency associated with a $B_0$ field strength of the magnetic resonance imaging system is between adjacent positive integer multiples of the characteristic frequency.

The Larmor frequency may be greater than the characteristic frequency and less than twice the characteristic frequency.

The Larmor frequency may be greater than twice the characteristic frequency and less than three times the characteristic frequency.

The output signal may comprise a direct current (DC) component and an alternating current (AC) ripple component, and wherein the characteristic frequency may comprise a frequency of the AC ripple component.

The at least one switching converter may be configured to differentially drive the at least one gradient coil, and the frequency of the AC ripple component may be a differential mode component of the AC ripple component.

The at least one switching power converter may comprise a plurality of switching power converters.

At least a first power converter of the plurality of switching power converters may have a switching frequency below the characteristic frequency and greater than zero.

The characteristic frequency may be a positive integer multiple of the switching frequency.

The plurality of switching power converters may be configured to switch such that a plurality of output signals of the plurality of switching power converters have frequency components that destructively interfere with one another.

At least two switching power converters of the plurality of switching power converters may be coupled in parallel.

At least two switching power converters of the plurality of switching power converters may be configured to switch out of phase from one another.

The plurality of switching power converters may comprise first and second switching power converters coupled in parallel and configured to switch 90 degrees out of phase from one another, and the first and second switching power converters may be configured to switch at a second frequency that is half of the characteristic frequency.

The at least one switching power converter may comprise at least one gallium nitride transistor.

The at least one switching power converter may comprise a high-side transistor coupled between the at least one gradient coil and a first power terminal and a low-side transistor coupled between the at least one gradient coil and a second power terminal.

Some embodiments relate to a magnetic resonance imaging system, comprising: a $B_0$ magnet configured to produce a $B_0$ magnetic field having an associated Larmor frequency; at least one gradient coil; and at least one switching power converter configured to provide, to the at least one gradient coil, an output signal having a characteristic frequency, wherein the Larmor frequency is between adjacent positive integer multiples of the characteristic frequency.

Some embodiments relate to a method for providing power to operate at least one gradient coil of a magnetic resonance imaging system, the method comprising: providing, to the at least one gradient coil, by at least one switching power converter, an output signal having a characteristic frequency, such that a Larmor frequency associated with a $B_0$ field strength of the magnetic resonance imaging system is between adjacent positive integer multiples of the characteristic frequency.

Some embodiments relate to an apparatus for providing power to operate at least one gradient coil of a magnetic resonance imaging system, the apparatus comprising: a first switching power converter configured to provide a first current to a first gradient coil of the at least one gradient coil; and a second switching power converter configured to provide a second current to the first gradient coil, wherein the first and second currents are balanced without any current-balancing circuitry.

The first and second switching power converters may be coupled in parallel.

The first and second switching power converters may be half bridges.

The first and second switching power converters may each comprise gallium nitride transistors.

The first and second currents may differ from one another in magnitude by less than 20% of a maximum output current of the first switching power converter.

Some embodiments relate to a magnetic resonance imaging system, comprising: a $B_0$ magnet; at least one radio frequency (RF) coil configured to transmit and/or receive magnetic resonance signals; at least one gradient coil; a first switching power converter configured to provide a first current to a first gradient coil of the at least one gradient coil; and a second switching power converter configured to provide a second current to the first gradient coil, wherein the first and second currents are balanced without any current-balancing circuitry.

The foregoing summary is provided by way of illustration and is not intended to be limiting.

BRIEF DESCRIPTION OF DRAWINGS

Various aspects and embodiments of the disclosed technology will be described with reference to the following figures. It should be appreciated that the figures are not necessarily drawn to scale. Items appearing in multiple figures are indicated by the same reference number in all the figures in which they appear.

DETAILED DESCRIPTION

Figure 1:
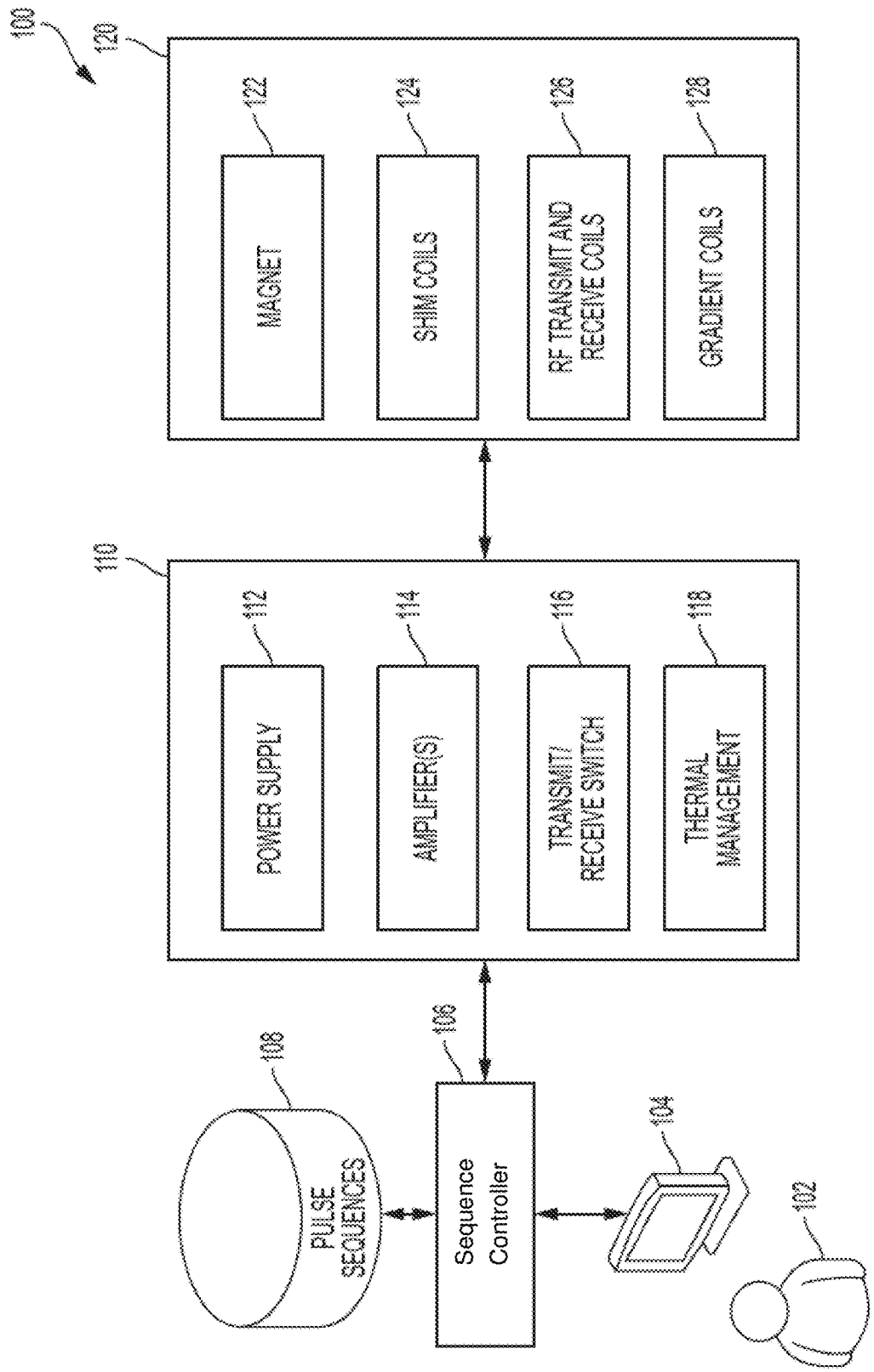
FIG. 1 is a block diagram of exemplary components of a magnetic resonance imaging system, in accordance with some embodiments.

The MRI scanner market is overwhelmingly dominated by high-field systems, and particularly for medical or clinical MRI applications. As discussed above, the general trend in medical imaging has been to produce MRI scanners with increasingly greater field strengths, with the vast majority of clinical MRI scanners operating at 1.5 T or 3 T, with higher field strengths of 7 T and 9 T used in research settings. As used herein, "high-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are often also characterized as "high-field." By contrast, "low-field" refers generally to MRI systems operating with a $B_0$ field of less than or equal to approximately 0.2 T, though systems having a $B_0$ field of between 0.2 T and approximately 0.3 T have sometimes been characterized as low-field.

Low-field MRI presents an attractive imaging solution, providing a relatively low cost, high availability alternative to high-field MRI. In particular, low-field MRI systems can be implemented as self-contained systems that are deployable in a wide variety of clinical settings where high-field MRI systems cannot due to cost, size and/or the need for a specialized facility. However, due to the lower field strengths, low-field MRI systems generally also have relatively low signal-to-noise ratio. As such, the design of low noise components may play a significant role in the development of low-field MRI systems.

Aspects of the technical developments described herein are derived from the inventor(s)' recognition of a need to provide relatively low noise and efficient power to one or more magnetic coils of an MRI system, particularly (though not limited to) low-field MRI systems where noise in the power source may be especially problematic. In this respect, the inventor(s) have developed power components to drive magnetic coil(s) suitable for relatively low noise operation.

Briefly, MRI involves placing a subject to be imaged (e.g., all or a portion of a patient) in a static, homogenous magnetic field $B_0$ to align a subject's atomic net magnetization (often represented by a net magnetization vector) in the direction of the $B_0$ field. One or more transmit coils are then used to generate a pulsed magnetic field $B_1$ having a frequency related to the rate of precession of atomic spins of the atoms in the magnetic field $B_0$ to cause the net magnetization of the atoms to develop a component in a direction transverse to the direction of the $B_0$ field. After the $B_1$ field is turned off, the transverse component of the net magnetization vector precesses, its magnitude decaying over time until the net magnetization re-aligns with the direction of the $B_0$ field. This process produces MR signals that can be detected, for example, by voltages induced in one or more receive coils of the MRI system.

In addition, MRI involves using gradient coils to induce gradients in the main magnetic field $B_0$ so that the MR signal emanating from particular spatial locations within the subject may be identified (i.e., gradient coils are used to spatially encode detected MR signals). An MR image is formed in part by pulsing the transmit coil(s) and/or the gradient coils in a particular sequence, referred to as a "pulse sequence," and using the receive coil(s) to sense MR signals induced by the pulse sequence. The detected MR signals may then be processed (e.g., "reconstructed") to form an image. A pulse sequence generally describes the order and timing in which transmit/receive coils and gradient coils operate to prepare the magnetization of the subject and acquire resulting MR data. For example, a pulse sequence may indicate an order of transmit pulses, gradient pulses, and acquisition times during which the receive coils acquire MR data.

To produce pulse sequences for MRI, power components are generally provided to drive magnetics components to produce magnetic fields in accordance with the prescribed pulse sequence. There are a number of considerations in the low-field context that make conventional high-field power solutions undesirable and/or unsuitable for low-field MRI. For example, while the cost of conventional high-field power components may be acceptable given the relative insignificance compared to the total cost of a high-field MRI installation, this cost may be unacceptably high in the context of a low-field MRI system that is designed as a lower cost alternative. Thus, the cost of a power component conventionally used for high-field MRI may be disproportionately large and therefore not satisfactory for some lower cost low-field MRI systems.

Additionally, a challenge in low-field MRI is the relatively low signal-to-noise ratio. In particular, the signal-to-noise ratio of an MR signal is related to the strength of the main magnetic field $B_0$, and is one of the factors driving clinical systems to operate in the high-field regime. Thus, the MR signal strength is relatively weak in the low-field context due to the low field strengths so that any additional noise in the system may have a relatively significant impact on image quality. In this respect, the inventor(s) have recognized that conventional power components for driving coils of a high-field MRI system may be unsuitable for low-field MRI system because they are not designed to drive the coils with sufficiently low noise. Although the noise injected by such power components may be acceptable in the high SNR regime of high-field MRI systems, such components generally do not provide a sufficiently low level of noise to provide acceptable image quality in a low-field MRI system. For example, conventional power components may exhibit unsatisfactory variation in the output (e.g., ripple) for use in the low-field context, injecting relatively significant noise into the gradient coil system of a low-field MRI system that may be difficult to distinguish from the signal to be detected.

The inventor(s) have developed switching power converters suitable for driving one or more magnetics components (e.g., coils) of a low-field MRI system while avoiding interference with detection of MRI signals of interest. Advantageously, the switching power converters may operate with relatively high efficiency and may be realized by low-cost components. While the switching power converters and associated techniques described herein are suitable for low-field MRI, they are not limited for use with low-field MRI systems and may be used with any suitable MRI system.

It should be appreciated that the embodiments described herein may be implemented in any of numerous ways. Examples of specific implementations are provided below for illustrative purposes only. It should be appreciated that the embodiments and the features/capabilities provided may be used individually, all together, or in any combination of two or more, as aspects of the technology described herein are not limited in this respect.

FIG. 1 is a block diagram of exemplary components of MRI system 100 (e.g., a low-field MRI system). In the illustrative example of FIG. 1, MRI system 100 comprises computing device 104, sequence controller 106, pulse sequences store 108, power management system 110, and magnetics components 120. It should be appreciated that system 100 is illustrative and that a MRI system may have one or more other components of any suitable type in addition to or instead of the components illustrated in FIG. 1.

As illustrated in FIG. 1, magnetics components 120 comprise $B_0$ magnet 122, shim coils 124, RF transmit and receive coils 126, and gradient coils 128. Magnet 122 may be used to generate the main magnetic field $B_0$. Magnet 122 may be any suitable type or combination of magnetics components that can generate a desired main magnetic $B_0$ field (e.g., any one or combination of electromagnet(s), printed magnetics, permanent magnet(s), etc.). Thus, a $B_0$ magnet refers herein to any one or combination of magnetics components of any type configured to produce a $B_0$ field. According to some embodiments, $B_0$ magnet 122 may produce or contribute to a $B_0$ field greater than or equal to approximately 20 mT and less than or equal to approximately 50 mT, greater than or equal to approximately 50 mT and less than or equal to approximately 0.1 T, greater than or equal to approximately 0.1 T and less than or equal to approximately 0.2 T, greater than or equal to approximately 0.2 T and less than or equal to approximately 0.3 T, greater than 0.3 T and less than or equal to approximately 0.5 T, etc. Shim coils 124 may be used to contribute magnetic field(s) to improve the homogeneity of the $B_0$ field generated by magnet 122.

Gradient coils 128 may be arranged to provide gradient fields and, for example, may be arranged to generate gradients in the $B_0$ field in three substantially orthogonal directions (X, Y, Z). Gradient coils 128 may be configured to encode emitted MR signals by systematically varying the $B_0$ field (the $B_0$ field generated by magnet 122 and/or shim coils 124) to encode the spatial location of received MR signals as a function of frequency or phase. For example, gradient coils 128 may be configured to vary frequency or phase as a linear function of spatial location along a particular direction, although more complex spatial encoding profiles may also be provided by using nonlinear gradient coils. For example, a first gradient coil may be configured to selectively vary the $B_0$ field in a first (X) direction to perform frequency encoding in that direction, a second gradient coil may be configured to selectively vary the $B_0$ field in a second (Y) direction substantially orthogonal to the first direction to perform phase encoding, and a third gradient coil may be configured to selectively vary the $B_0$ field in a third (Z) direction substantially orthogonal to the first and second directions to enable slice selection for volumetric imaging applications.

As discussed above, MRI is performed by exciting and detecting emitted MR signals using transmit and receive coils, respectively (often referred to as radio frequency (RF) coils). Transmit/receive coils may include separate coils for transmitting and receiving, multiple coils for transmitting and/or receiving, or the same coils for transmitting and receiving. Transmit/receive coils are also often referred to as Tx/Rx or Tx/Rx coils to generically refer to the various configurations for the transmit and receive magnetics component of an MRI system. These terms are used interchangeably herein. In FIG. 1, RF transmit and receive coils 126 comprise one or more transmit coils that may be used to generate RF pulses to induce an oscillating magnetic field $B_1$. The transmit coil(s) may be configured to generate any suitable types of RF pulses. For example, the transmit coil(s) may be configured to generate any of the pulse sequences described in U.S. patent application Ser. No. 14/938,430 ('430 application), titled "Pulse Sequences for Low Field Magnetic Resonance," filed Nov. 11, 2015, which is herein incorporated by reference in its entirety.

Each of magnetics components 120 may be constructed in any suitable way. For example, in some embodiments, one or more (e.g., all) of magnetics components 120 may be fabricated, constructed or manufactured using techniques described in U.S. patent application Ser. No. 14/845,652 ('652 application), titled "Low-field Magnetic Resonance Imaging Methods and Apparatus," and filed Sep. 4, 2015, which is herein incorporated by reference in its entirety. However, the techniques described herein are not limited in this respect, as any suitable technique may be used to provide the magnetics components 120.

Power management system 110 includes electronics to provide operating power to one or more components of the low-field MRI system 100. For example, as discussed in more detail below, power management system 110 may include one or more switching power supplies, gradient power components, transmit coil components, and/or any other suitable power electronics needed to provide suitable operating power to energize and operate components of the low-field MRI system 100.

As illustrated in FIG. 1, power management system 110 comprises power supply 112, amplifier(s) 114, transmit/receive switch 116, and thermal management components 118. Power supply 112 includes electronics to provide operating power to magnetic components 120 of the MRI system 100. For example, power supply 112 may include electronics to provide operating power to one or more $B_0$ coils (e.g., $B_0$ magnet 122) to produce the main magnetic field for the low-field MRI system. In some embodiments, power supply 112 is a unipolar, continuous wave (CW) power supply, however, any suitable power supply may be used. Transmit/receive switch 116 may be used to select whether RF transmit coils or RF receive coils are being operated.

Amplifier(s) 114 may include one or more RF receive (Rx) pre-amplifiers that amplify MR signals detected by one or more RF receive coils (e.g., coils 126), one or more RF transmit (Tx) power components configured to provide power to one or more RF transmit coils (e.g., coils 126), one or more gradient power components configured to provide power to one or more gradient coils (e.g., gradient coils 128), and one or more shim power components configured to provide power to one or more shim coils (e.g., shim coils 124).

Thermal management components 118 provide cooling for components of low-field MRI system 100 and may be configured to do so by facilitating the transfer of thermal energy generated by one or more components of the low-field MRI system 100 away from those components. Thermal management components 118 may include, without limitation, components to perform water-based or air-based cooling, which may be integrated with or arranged in close proximity to MRI components that generate heat including, but not limited to, $B_0$ coils, gradient coils, shim coils, and/or transmit/receive coils. Thermal management components 118 may include any suitable heat transfer medium including, but not limited to, air and liquid coolant (e.g., water), to transfer heat away from components of the low-field MRI system 100.

As illustrated in FIG. 1, MRI system 100 includes sequence controller 106 (also referred to as a console) having control electronics to send instructions to and receive information from power management system 110. Sequence controller 106 may be configured to implement one or more pulse sequences, which are used to determine the instructions sent to power management system 110 to operate the magnetic components 120 in a desired sequence. For example, for embodiments wherein MRI system 100 operates at low-fields, sequence controller 106 may be configured to control power management system 110 to operate the magnetic components 120 in accordance with a zero echo time (ZTE) pulse sequence, a balanced steady-state free precession pulse sequence (LF-bSSFP), a gradient echo pulse sequence, a spin echo pulse sequence, an inversion recovery pulse sequence, arterial spin labeling, diffusion weighted imaging (DWI), and/or any other pulse sequence specified for operation in the low-field context. Pulse sequences for low-field MRI may be applied for different contrast types such as T1-weighted and T2-weighted imaging, diffusion-weighted imaging, arterial spin labeling (perfusion imaging), Overhauser imaging, etc. However, any pulse sequence may be used, as the aspects are not limited in this respect. Sequence controller 106 may be implemented as hardware, software, or any suitable combination of hardware and software, as aspects of the disclosure provided herein are not limited in this respect.

In some embodiments, sequence controller 106 may be configured to implement a pulse sequence by obtaining information about the pulse sequence from pulse sequences repository 108, which stores information for each of one or more pulse sequences. Information stored by pulse sequences repository 108 for a particular pulse sequence may be any suitable information that allows sequence controller 106 to implement the particular pulse sequence. For example, information stored in pulse sequences repository 108 for a pulse sequence may include one or more parameters for operating magnetics components 120 in accordance with the pulse sequence (e.g., parameters for operating the RF transmit and receive coils 126, parameters for operating gradient coils 128, etc.), one or more parameters for operating power management system 110 in accordance with the pulse sequence, one or more programs comprising instructions that, when executed by sequence controller 106, cause sequence controller 106 to control system 100 to operate in accordance with the pulse sequence, and/or any other suitable information. Information stored in pulse sequences repository 108 may be stored on one or more non-transitory storage media.

As illustrated in FIG. 1, sequence controller 106 also interacts with computing device 104 programmed to process received MR data. For example, computing device 104 may process received MR data to generate one or more MR images using any suitable image reconstruction process(es). Sequence controller 106 may provide information about one or more pulse sequences to computing device 104 for the processing of data by the computing device. For example, sequence controller 106 may provide information about one or more pulse sequences to computing device 104 and the computing device may perform an image reconstruction process based, at least in part, on the provided information.

Computing device 104 may be any electronic device that may process acquired MR data and generate one or more images of the subject being imaged. In some embodiments, computing device 104 may be a fixed electronic device such as a desktop computer, a server, a rack-mounted computer, a workstation, or any other suitable fixed electronic device that may be configured to process MR data and generate one or more images of the subject being imaged. Alternatively, computing device 104 may be a portable device such as a smart phone, a personal digital assistant, a laptop computer, a tablet computer, or any other portable device that may be configured to process MR data and generate one or images of the subject being imaged. In some embodiments, computing device 104 may comprise multiple computing devices of any suitable type, as aspects of the disclosure provided herein are not limited in this respect. A user 102 may interact with computing device 104 to control aspects of the low-field MR system 100 (e.g., program the system 100 to operate in accordance with a particular pulse sequence, adjust one or more parameters of the system 100, etc.) and/or view images obtained by the low-field MR system 100.

As discussed above, the inventor(s) have recognized that conventional power components for driving coils of a high-field MRI system are generally unsuitable for low-field MRI systems because they are not designed to drive the coils with low noise. Although the noise injected by such power components may be acceptable in high-field MRI systems having a high SNR, such power components may not provide a sufficiently low level of noise to provide acceptable image quality in a low-field MRI system. The low SNR of low-field MRI increases the need for power components to drive one or more coils of a low-field MRI system that reduce the noise injected that may interfere with detecting signals of interest. Although linear amplifiers have been developed which may inject relatively low noise, the inventor(s) have appreciated that linear amplifiers have higher power dissipation than switching power converters. Higher power dissipation both reduces efficiency and increases the need for thermal management. An increased need for thermal management may increase the cost, size and complexity of the system.

Some high-field MRI systems use power components having a switching power converter to drive current through the coils. Although switching power converters can provide high efficiency, the inventor(s) have recognized and appreciated that conventional switching converters can introduce a significant amount of switching noise into the system because they may switch at frequencies in a range (e.g., in a range of tens to hundreds of kHz) that can impact the detection of MR signals emitted in response to the pulse sequences. For example, the switching frequencies and/or their harmonics of conventional switched power converters may overlap with operational frequencies of the MRI system (e.g., the frequencies to which the transmit and/or receive coils are tuned to resonate), and therefore add noise to operation of the low-field MRI system. The transmit and/or receive coils may be tuned to the Larmor frequency, which may be characteristic of a field strength of a $B_0$ magnetic field provided by magnetics components 120, as well as a particular atomic species (e.g., a desired atomic species to be imaged). For example, the atomic species may emit magnetic signals at the Larmor frequency when placed in the $B_0$ magnetic field. Although the noise injected by such power converters may not be significant in a high-field MRI system, the level of noise injected may be unacceptable in a low-field MRI system, and may degrade imaging quality (e.g., detectability of magnetic signals emitted by an atomic species). Additionally, the difference in the transmit/receive frequencies in high-field MRI typically allow for switching noise to be filtered out more easily as the switching noise typically will be out of band with respect to the transmit/receive frequencies (the switching frequencies and/or harmonics are much lower than the B1 frequency (transmit frequency), and therefore much easier to filter-out). One solution may be to switch at a switching frequency above the frequency of operation of the MRI system (e.g., the Larmor frequency). However, switching at a high frequency may increase power dissipation, leading to reduced efficiency and an increased need for thermal management, as described above.

To address this problem, the inventor(s) have developed power components incorporating switching power converters configured to reduce or eliminate switching noise that would otherwise impact operation of low-field MRI systems. For example, the inventor(s) developed techniques for controlling the frequencies at which switching noise may be generated by a switching power converter, such that interference of switching noise with operational frequencies of the system (e.g., transmit/receive imaging frequencies, the Larmor frequency, etc.) is reduced or eliminated. As a result, power components developed by the inventor(s) may generate little to no switching noise at operational frequencies. Such power components may be particularly advantageous in low-field MRI systems which, as discussed above, can benefit from efficient, low-noise power components.

In some embodiments, a switching power converter may have a characteristic frequency such that operational frequencies of the MRI system (such as transmit and/or receive frequencies and/or the Larmor Frequency) are positioned between integer multiples of the characteristic frequency. The characteristic frequency of a switching power converter may be a frequency of the ripple component at the output of the power converter. In some embodiments, a plurality of power converters may drive the gradient coil differentially. In differential configurations (e.g., FIG. 5A, FIG. 6A), the output ripple has two independent components; the differential mode (DM) and common mode (CM), and the characteristic frequency as used herein is the fundamental frequency of the differential mode component of the output ripple. The fundamental frequency of a signal is the lowest frequency component in a Fourier series decomposition of the signal. When a plurality of power converters drive the gradient coil the output ripple signal that has the characteristic frequency is the combined output of all the power converters driving the gradient coil.

With a single switching power converter, the switching power converter may have a switching frequency, which is the frequency at which the power switches of the power converter switch. Although filtering may be performed at the output, a ripple component at the switching frequency appears in the signal at the output of the switching power converter. As a result, a signal with the frequency of the ripple component and non-zero integer multiples thereof (i.e., harmonics) is injected into the system, which may interfere with MRI measurements. To address this problem, the switching frequency and/or other characteristics of the switching power converter may be selected to position the operational frequencies of the MRI system between adjacent positive integer multiples of the characteristic frequency of the switching power converter. Accordingly, the characteristic frequency of the power converter and its harmonics (i.e., noise components) are positioned out-of-band with respect to the operational frequencies of the MRI system, which can improve SNR. Further, selecting the frequencies in this manner may enable switching at a relatively low frequency, which may reduce power dissipation.

Figure 4:
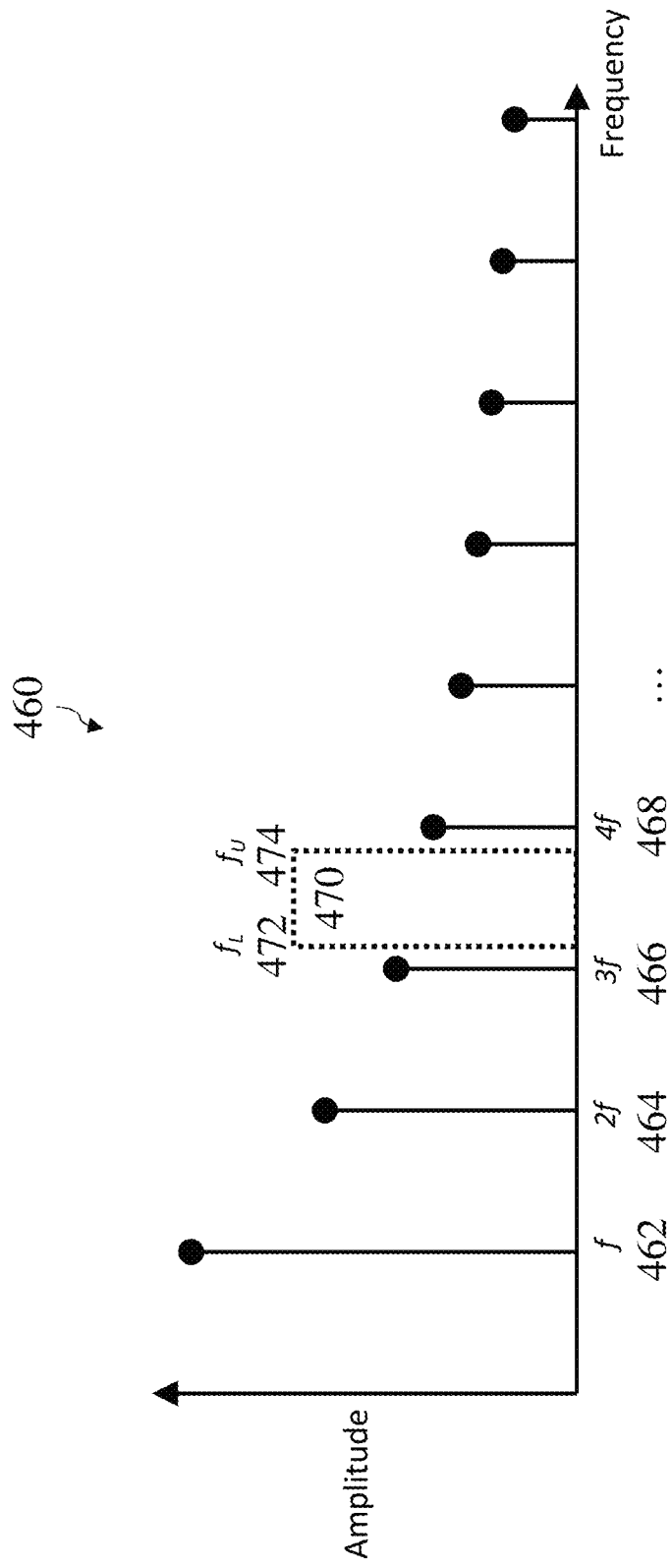
FIG. 4 is a graph illustrating power spectral density of operational frequencies of an MRI system, a switching frequency of a switching power converter, and switching noise generated by the switching power converter, in accordance with some embodiments.

FIG. 4 shows graph 460 illustrating frequency components present in an output of a switching power converter at characteristic frequency f and its harmonics, as well as band 470, which is the operational frequency band of an MRI system. The operational frequency band 470 may include the Larmor frequency and/or a transmit and/or receive frequency of an MRI system. As illustrated, band 470 is positioned between adjacent integer multiples of characteristic frequency f, i.e., between three and four times the characteristic frequency f, in this example. Because operational frequency band 470 may be positioned between adjacent positive integer multiples of the characteristic frequency f, switching noise at integer multiples of the characteristic frequency f may not interfere with signals within operational frequency band 470. Although an example is illustrated positioning band 470 between integer multiples three and four (3f and 4f) of the characteristic frequency f, band 470 may be positioned between other adjacent positive integer multiples of the characteristic frequency f, such as between multiples one and two (f and 2f), between multiples two and three (2f and 3f), between multiples four and five (4f and 5f), and so on.

In some embodiments, the characteristic frequency of a switching power converter may be different from the switching frequency of the switching power converter. For example, a switching power converter may include a plurality of switching power converters that are operated out of phase from one another. By appropriately selecting the number and phase relationship of the switching power converters the ripple at the output of the switching power converter as a whole may be a positive integer multiple of the switching frequency of the individual switching power converters. Examples of such a switching power converter will be described below following a more general discussion of the electronic components of the MRI system.

Figure 2:
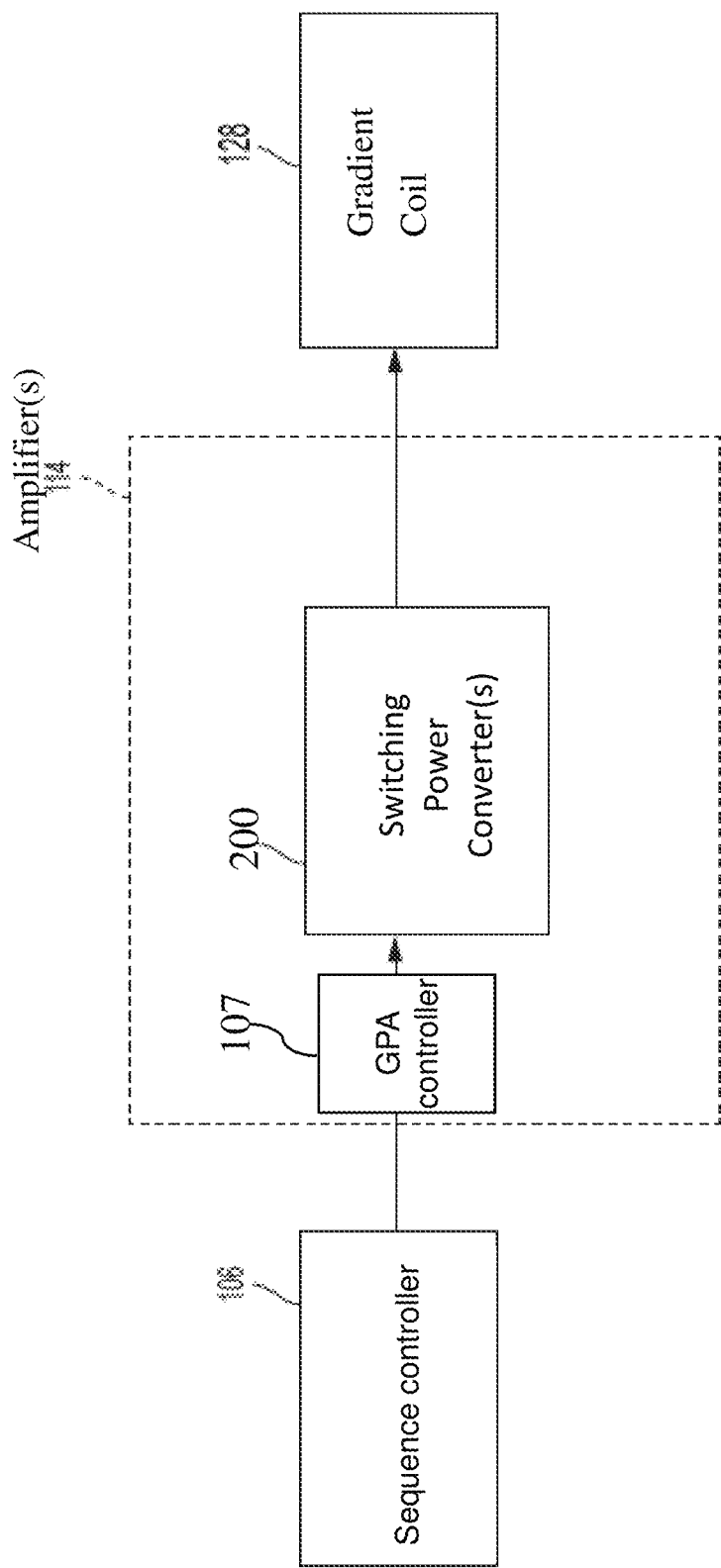
FIG. 2 is a block diagram of a sequence controller, one or more amplifiers, and one or more gradient coils, in accordance with some embodiments.

FIG. 2 is a block diagram illustrating sequence controller 106, amplifier(s) 114 and gradient coil 128 of MRI system 100, in accordance with some embodiments. Amplifier(s) 114 include GPA controller 107 and switching power converter(s) 200, which may provide an output signal and/or current to gradient coil 128 responsive to commands (e.g., control voltages) from sequence controller 106. In FIG. 2, amplifier(s) 114 may be configured to drive a current through gradient coil 128, such as to produce a magnetic field in accordance with a desired pulse sequence. For example, amplifier(s) 114 may drive a current through gradient coil 128 in response to a control signal from the sequence controller 106. Sequence controller 106 may produce a control signal to drive amplifier 114 based on a pulse sequence implemented by sequence controller 106 (or provided by one or more other controllers), as discussed above. It should be appreciated that techniques described herein may be applied to other coils of system 100, such as a coil of magnet 122, shim coil 124, or an RF transmit and/or receive coil 126. For example, switching power components configured to provide signals to such coils may be configured to reduce or eliminate switching noise at operational frequencies of an MRI system in the manner described herein for gradient coil(s) 128.

In some embodiments, amplifier(s) 114 may include a "current mode" amplifier that drives a desired current through gradient coil 128. The desired current may be produced by amplifier(s) 114 in response to a current command from sequence controller 106. In this respect, amplifier 114 may operate as a current source that is controlled by the current command, which may be provided by the sequence controller 106 as a control voltage having an amplitude level indicating an amount of current to be provided to gradient coil 128. For example, sequence controller 106 may change the control voltage such that amplifier(s) 114 produces current values that change in accordance with a selected pulse sequence. The pulse sequence indicated in the control voltage may include a plurality of gradient pulses. For each gradient pulse, switching power converter(s) 200 may provide one or more corresponding pulses of current to gradient coil 128. In some embodiments, the control voltage may be used to generate a modulated (e.g., pulse width modulated) signal. For example, in some embodiments, the modulated signal may be generated based on the amplitude of the control voltage. Alternatively or additionally, in some embodiments, the modulated signal may be generated based on a voltage difference between the control voltage and an output signal (e.g., with the output signal indicating the output current level).

Figure 3A:
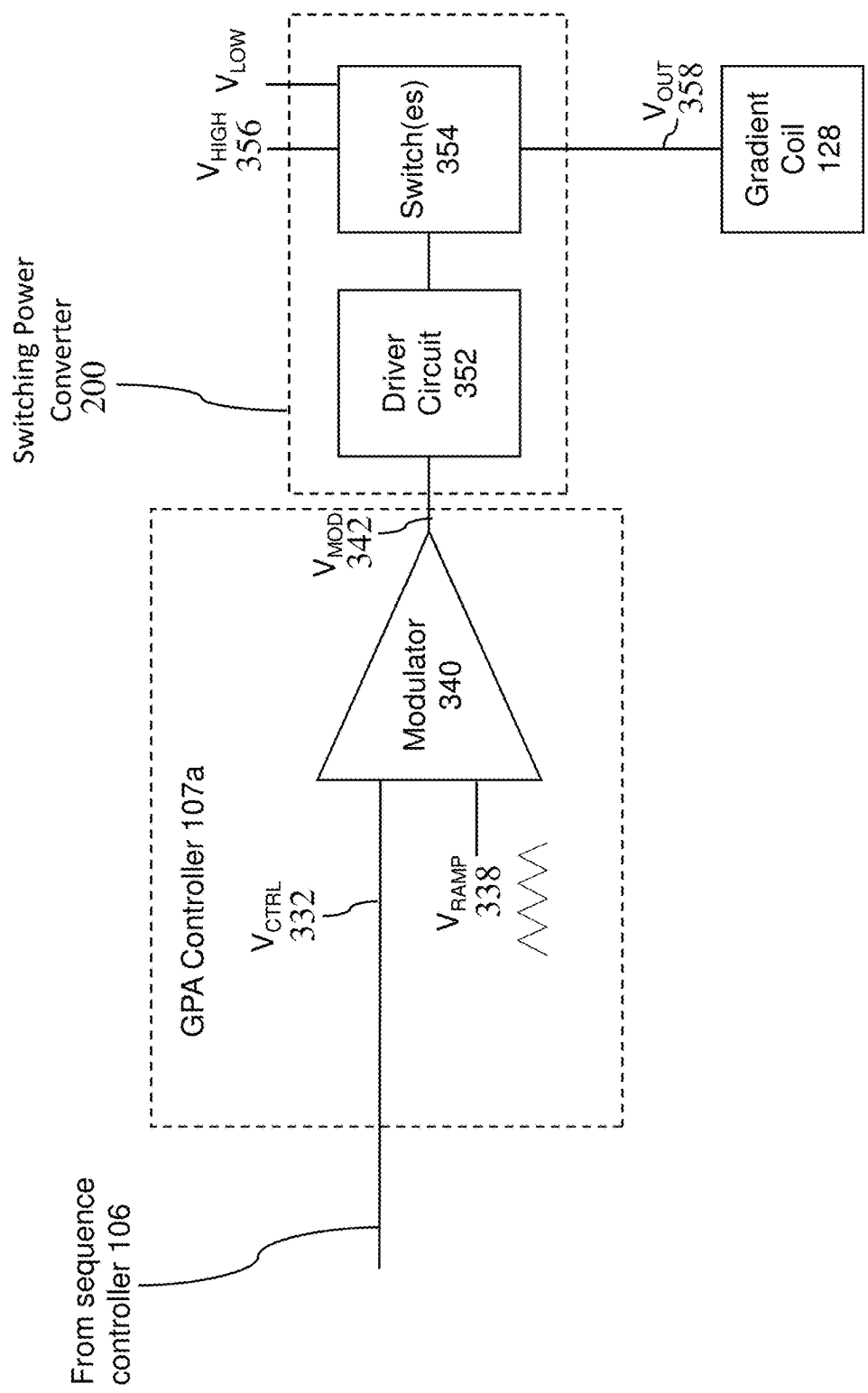
FIG. 3A is a block diagram of an exemplary GPA controller for a switching power converter, in accordance with some embodiments.

FIG. 3A is a block diagram of an example of a GPA controller 107a and switching power converter 200, in accordance with some embodiments. In FIG. 3A, GPA controller 107a includes modulator 340 coupled between sequence controller 106 and switching power converter 200. Switching power converter 200 is coupled to gradient coil 128. Based on control voltage $V_{CTRL}$ 332 from sequence controller 106, switching power converter 200 may provide output signal $V_{OUT}$ 358 to gradient coil 128.

Modulator 340 may be configured to generate modulated signal $V_{MOD}$ 342 using control voltage $V_{CTRL}$ 332. For example, modulated signal $V_{MOD}$ 342 may be a pulse width modulated (PWM) signal. In the illustrative embodiment of FIG. 3A, modulator 340 includes a comparator configured to compare (e.g., continuously) control voltage $V_{CTRL}$ 332 to ramp voltage $V_{RAMP}$ 338 to generate modulated signal $V_{MOD}$ 342. In some embodiments, an oscillator may provide a signal at a fixed frequency to an integrator, which may generate ramp voltage $V_{RAMP}$ 338 therefrom. In some embodiments, modulator 340 may output a logical high voltage when control voltage $V_{CTRL}$ 332 is higher than ramp voltage $V_{RAMP}$ 338, and modulator 340 may output a logical low voltage when control voltage $V_{CTRL}$ 332 is lower than ramp voltage $V_{RAMP}$ 338. For instance, control voltage $V_{CTRL}$ 332 may be higher than ramp voltage $V_{RAMP}$ 338 for only a portion of a clock period (e.g., the clock period of ramp voltage $V_{RAMP}$ 338), and the portion may increase as control voltage $V_{CTRL}$ 332 increases. Accordingly, a pulse width (e.g., duration in time of the logical high portion) of modulated signal $V_{MOD}$ 342 may increase as control voltage $V_{CTRL}$ 332 increases.

Switching power converter 200 is configured to generate output signal $V_{OUT}$ based on modulated signal 342. Switching power converter 200 may include a driver circuit 352 and switch(es) 354 driven by the driver circuit 352. In some embodiments, switches 354 may be arranged as a half bridge. Driver circuit 352 may amplify modulated signal 342 and turn switches 354 on and off in accordance with the amplified modulated signal 342. For example, the logical high portion of modulated signal 342 may cause one or more of switches 354 to close, connecting high power supply voltage $V_{HIGH}$ to gradient coil 128. One or more switches 354 may be opened during the logical high portion of modulated signal 342, isolating gradient coil 128 from a low voltage $V_{LOW}$ (e.g., ground) Likewise, the logical low portion of modulated signal 342 may open one or more switches that connect high power supply voltage $V_{HIGH}$ to gradient coil 128 and close one or more switches which connect gradient coil 128 to ground. Accordingly, in some embodiments, a frequency of modulated signal $V_{MOD}$ 342 may be the same as the switching frequency $f_{SW}$ 462 of switching power converter 200. Output signal $V_{OUT}$ 358 may have a high voltage during the logical high portion of modulated signal 342 and may have a low voltage during the logical low portion of modulated signal 342. As a result, in FIG. 3A, output signal $V_{OUT}$ 358 may have switching frequency $f_{SW}$ 462.

In some embodiments, output signal $V_{OUT}$ 358 may be provided to a filtering circuit which may provide smoothing (e.g., low-pass filtering) of $V_{OUT}$ 358 prior to reaching gradient coil 128.

Figure 3B:
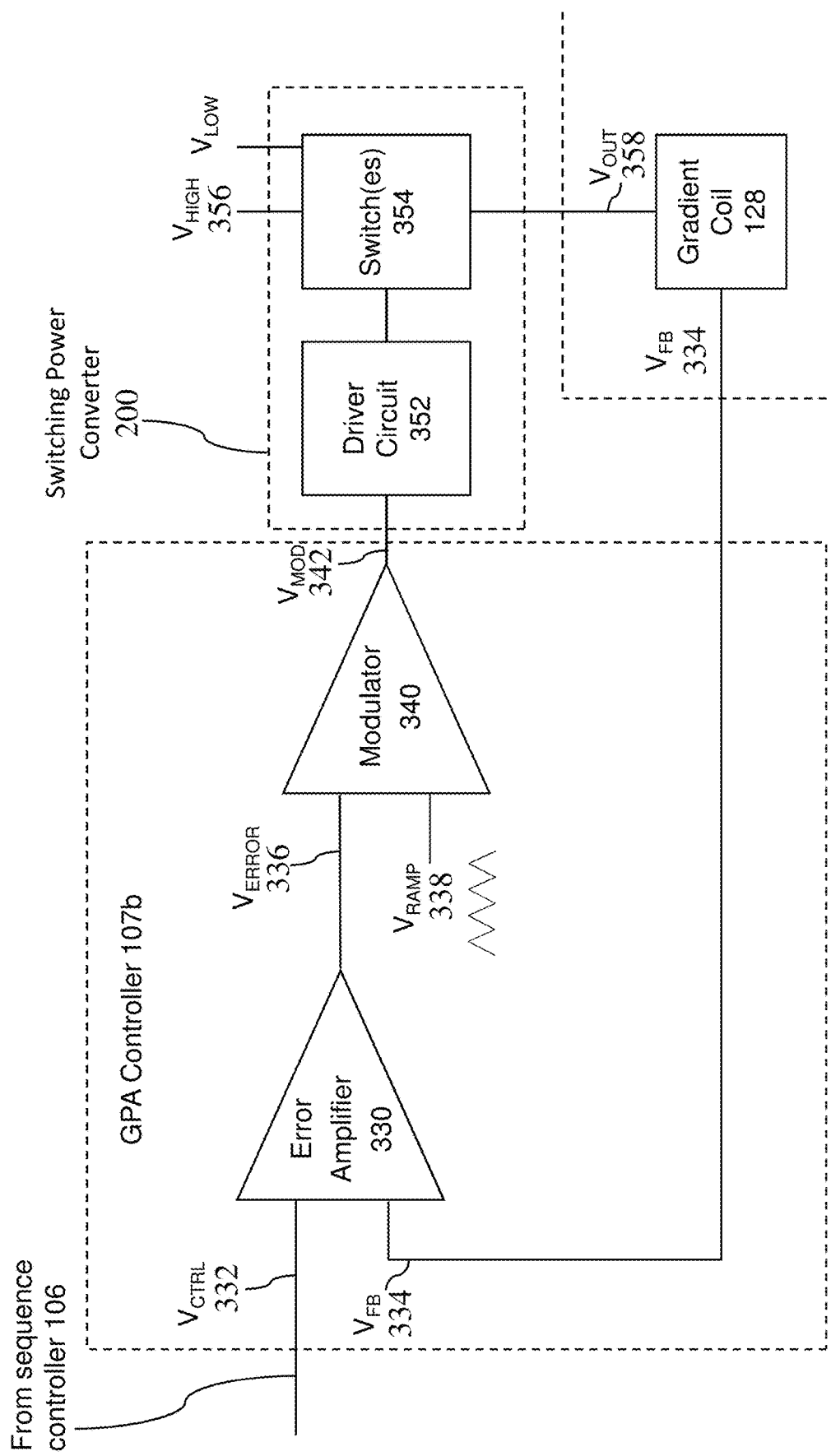
FIG. 3B is a block diagram of an alternative exemplary GPA controller for a switching power converter, in accordance with some embodiments.

FIG. 3B is a block diagram showing another example of a GPA controller 107b. GPA controller 107b may incorporate feedback from gradient coil 128 when generating modulated signal 342. In FIG. 3B, GPA controller 107b further includes an error amplifier 330 configured to provide an error voltage signal $V_{ERROR}$ 336 for modulator 340 to generate modulated signal $V_{MOD}$ 342. Error amplifier 330 may include an operational amplifier (Op-Amp).

Sequence controller 106 may provide control voltage $V_{CTRL}$ 332 as a desired value (or a fraction or multiple of a desired value) for output signal $V_{OUT}$ 358. Feedback voltage $V_{FB}$ 334 may be sensed at gradient coil 128 and provided to error amplifier 330, which may amplify a voltage difference between control voltage $V_{CTRL}$ 332 and feedback voltage $V_{FB}$ 334. The amplified voltage difference, error voltage $V_{ERROR}$ 336, may represent an error in output signal $V_{OUT}$ 358 indicated by feedback voltage $V_{FB}$ 334.

In some embodiments, modulated signal $V_{MOD}$ 342 may be a PWM signal. For example, modulator 340 may include a comparator configured to compare error voltage $V_{ERROR}$ 336 to ramp voltage $V_{RAMP}$ 338. As a result, the pulse width of modulated signal 342 may increase as the difference between control voltage $V_{CTRL}$ 332 and feedback voltage $V_{FB}$ 334 increases. In some embodiments, when feedback voltage $V_{FB}$ 334 is lower than control voltage $V_{CTRL}$ 332, the pulse width of modulated signal $V_{MOD}$ 342 may be high, resulting in a large output current provided to gradient coil 128, and an increase in feedback voltage $V_{FB}$ 334 until feedback voltage $V_{FB}$ 334 reaches control voltage $V_{CTRL}$ 332. It should be appreciated that, in accordance with various embodiments, feedback voltage $V_{FB}$ 334 may be equal to output signal $V_{OUT}$ 358, or may be equal to a fraction or multiple of output signal $V_{OUT}$ 358. For example, control voltage $V_{CTRL}$ 332 may be predetermined such that, when feedback voltage $V_{FB}$ 334 reaches control voltage $V_{CTRL}$ 332, output signal $V_{OUT}$ 358 reaches a desired voltage (e.g., for a pulse sequence).

Figure 5A:
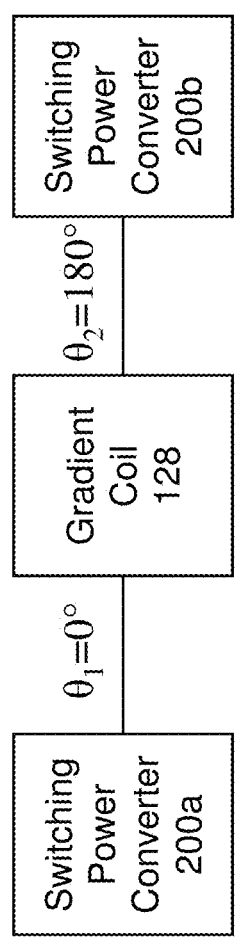
FIG. 5A shows an arrangement of two switching power converters driving a gradient coil.

FIG. 5A shows a differential or full-bridge configuration, in which the switching power converter(s) 200a, 200b include a first switching power converter 200a driving one end of the gradient coil 128 and a second switching power converter 200b driving the other end of the gradient coil 128. The two switching power converters may be switched 180 degrees out of phase from one another with the same duty cycle and the same switching frequency. Such a differential configuration may at least partially cancel the components of the power converters' output ripple at the switching frequency.

Figure 5B:
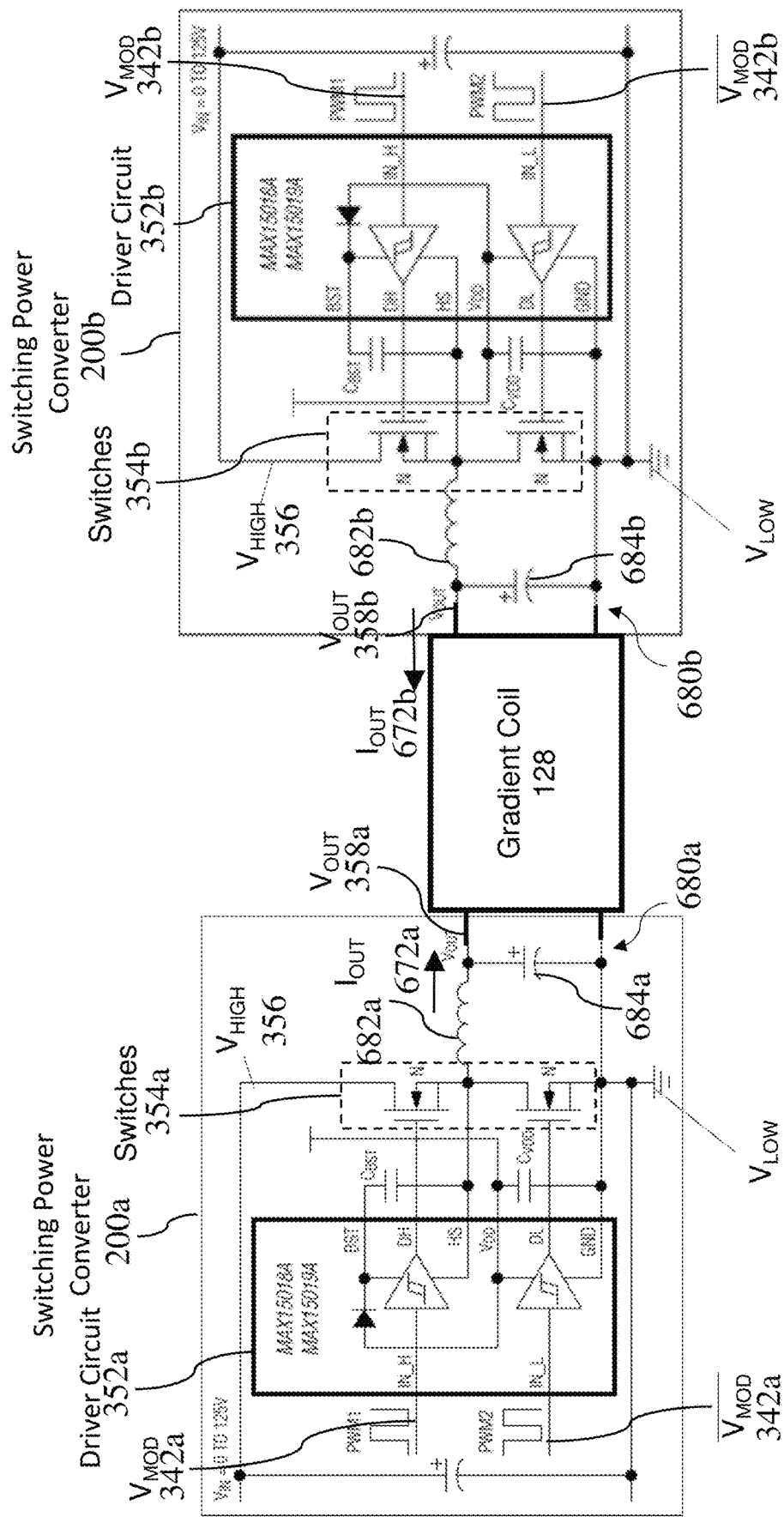
FIG. 5B is a circuit diagram illustrating two of the switching power converters of FIG. 5A, in accordance with some embodiments.

FIG. 5B is a circuit diagram showing an example of a differential or full-bridge configuration of FIG. 5A, in accordance with some embodiments. Switching power converters 200a-200b include respective driver circuits 352 (here, 352a-354b) and switches 354 (here, 354a-354b). In FIG. 5B, filters 680a-680b are implemented by inductors 682a-682b and capacitors 684a-684b. Switches 354 are arranged as half bridges in this example Switching power converters 200a-200b are configured to receive modulated signals 342a-342b and generate output signals $V_{OUT}$ 358a-358b. For example, modulated signals 342a-342b may be generated in the manner described herein including with reference to FIGS. 3A-3B or FIG. 7. Driver circuits 352a-352b may be configured to generate voltage signals for turning switches 354a-354b on or off. Because switches 354a-354b are n-type transistors a high turn-on voltage may be applied to turn on switches 354a-354b. Accordingly, driver circuits 352a-352b may amplify modulated signals 342a-342b to sufficient levels for turning on switches 354a-354b. In some embodiments, driver circuits 352a-352b may further provide a low (e.g., negative) voltage signal to control terminals of switches 354a-354b to turn them off during the logical low portion of modulated signals 342a-342b. In some embodiments, driver circuits 352a-352b may include bootstrap capacitors (e.g., $C_{BST}$) to facilitate startup of switching power converters 200a-200b. In some embodiments, one or each of switching power converters 200a-200b may be coupled to a negative high power supply voltage $V_{HIGH}$ rather than positive high power supply voltage $V_{HIGH}$ 356.

Switches 354a-354b may be turned on and/or off in accordance with logical high portions and logical low portions of modulated signals 342a-342b. In some embodiments, switches 354a-354b may be gallium nitride (GaN) transistors. For example, switches 354a-354b may include n-type GaN high electron mobility transistors (HEMTs). The top switch of switches 354a may couple high power supply voltage $V_{HIGH}$ 356 to inductor 682a when the top switch is on, and the bottom switch of switches 354b may couple inductor 682a to $V_{LOW}$ (e.g., ground) when the bottom switch is on. In FIG. 5B, the bottom switch receives an inverted version of modulated signal 342a, which may be in a logical high state when modulated signal 342a is in a logical low state, and vice versa. Accordingly, when modulated signal 342a is in a logical high portion, inductor 682a may be coupled to high power supply voltage $V_{HIGH}$ 356 via the top switch, and when modulated signal 342a is in a logical low portion, inductor 682a may be coupled to ground. It should be appreciated that, in accordance with various embodiments, switches 354a-354b may alternatively or additionally include metal oxide semiconductor field effect transistors (MOSFETs), bipolar junction transistors (BJTs), heterojunction bipolar transistors (HBTs), and/or the like. Further, in some embodiments, inductor 682a may be coupled to a negative power supply voltage or a positive supply voltage rather than ground.

Driver circuit 352b and switches 354b may operate responsive to modulated signal 342b in the manner described herein for driver circuit 352a and switches 354a responsive to modulated signal 342a. Moreover, because modulated signals 342a and 342b may be out of phase from one another, inductor 682a may be coupled to high power supply voltage $V_{HIGH}$ 356 when inductor 682b is coupled to ground. For example, in some embodiments, modulated signal 342b may be equal to the inverted version of modulated signal 342a provided to the bottom switch of switches 354a, such as when modulated signals 342a and 342b are 180 degrees out of phase from one another.

Figure 5C:
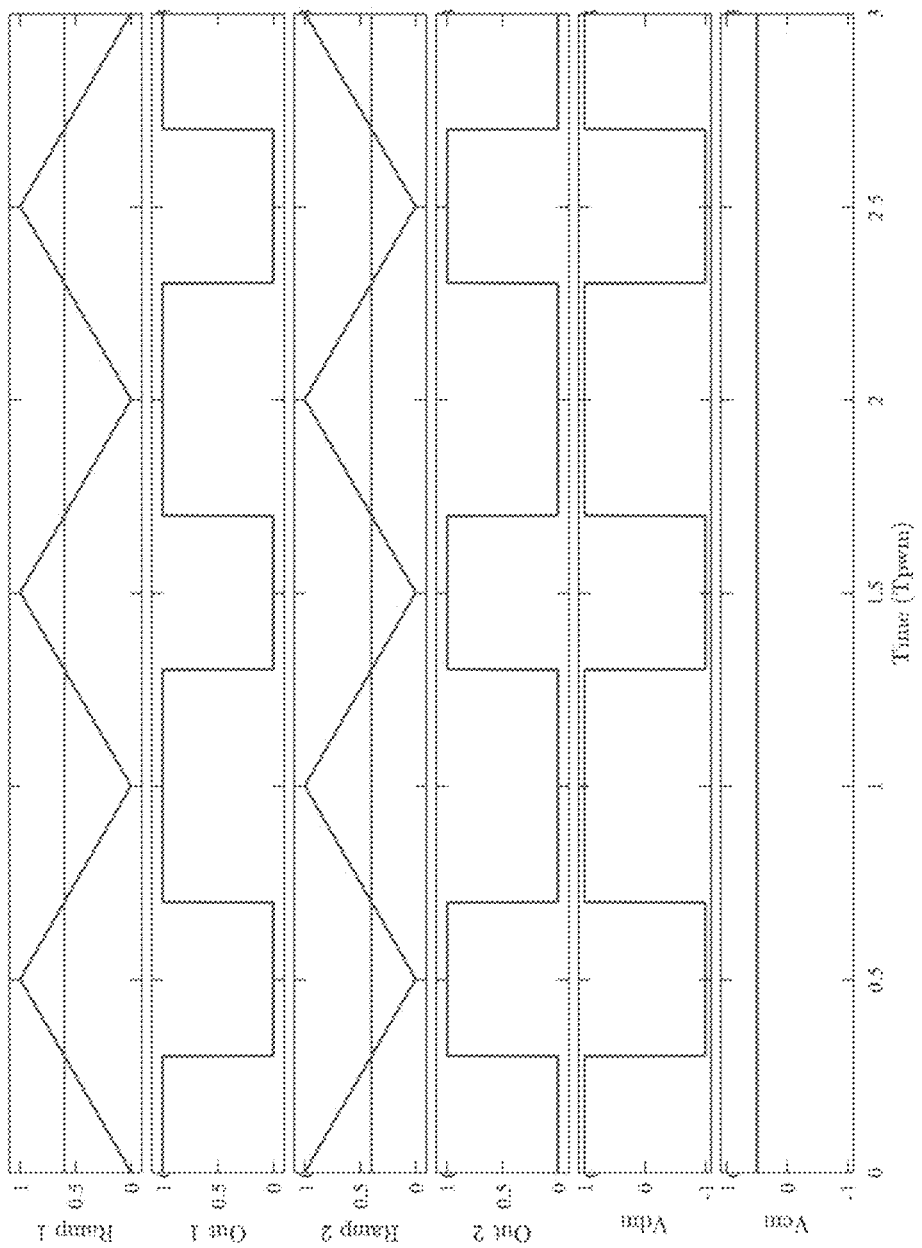
FIG. 5C shows a timing diagram illustrating signals corresponding to the switching power converters of FIGS. 5A and 5B, where the switching power converters are switched 180 degrees out of phase from one another.

FIG. 5C shows a timing diagram illustrating signals corresponding to the switching power converters 200 of FIGS. 5A and 5B, where the switching power converters 200a and 200b are switched 180 degrees out of phase from one another with complementary duty cycles. In this example, Out 1 has duty cycle of D=0.6 and Out 2 has duty cycle of D'=0.4. The switching power converters 200a and 200b have the same switching frequency in this example. Ramp 1 is $V_{RAMP}$ for power converter 200a, Out 1 is $V_{OUT}$ 358a for power converter 200a, ramp 2 is $V_{RAMP}$ for power converter 200b, and Out 2 is $V_{OUT}$ 358b for power converter 200b. A threshold used for comparison with each ramp signal is also shown. Vdm is the differential mode voltage between the outputs of the two power converters, which is the voltage across the gradient coil 128. Vcm is the common mode voltage, which is the sum of the outputs of the two power converters. All voltages are normalized in FIG. 5C. As can be seen, Vcm is constant, and therefore does not produce interference at frequencies of interest. However, Vdm has a fundamental component at the same frequency as the switching frequency of the switching power converters 200a and 200b. As defined above, since the gradient coil is driven differentially, the characteristic frequency is the fundamental component of Vdm, which in this case is the same as the switching frequency.

Figure 5D:
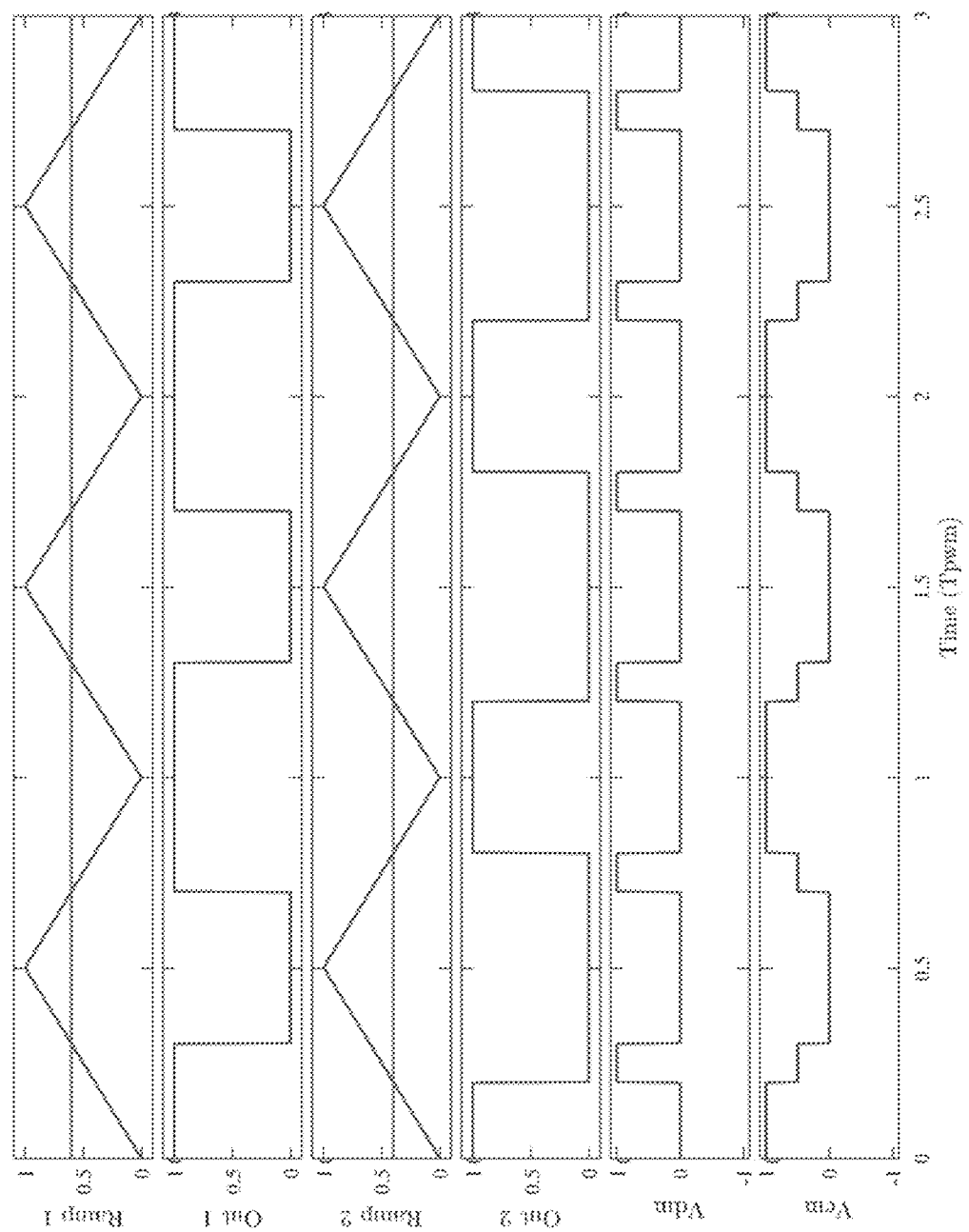
FIG. 5D shows another example of a timing diagram for the same circuit configuration as FIGS. 5A and 5B, but with the two switching power converters switched in-phase.

FIG. 5D shows another example of a timing diagram for the same circuit configuration as FIGS. 5A and 5B. The duty cycles are the same as in FIG. 5C, but with the two switching power converters switched in-phase (θ1=0, θ2=0). As can be seen, Vdm goes high twice per switching period. As defined above, since the gradient coil is driven differentially, the characteristic frequency is the fundamental component of Vdm, which in this case is twice the switching frequency of the switching power converters 200a and 200b. Vcm also varies over time, but the common mode can be more easily filtered out (e.g., with a common mode choke).

The inventor(s) have also developed techniques for reducing or eliminating the impact of switching noise generated by multiple switching power converters 200 by configuring the switching parallel-connected power converters to switch out of phase from one another (e.g., on a same side of gradient coil 128). As shown in FIG. 4, the inventor(s) recognized that switching noise at some integer multiples of switching frequency $f_{SW}$ 462 may be cancelled through destructive interference due to the out of phase switching relationship. For example, signals having switching frequency $f_{SW}$ 462 (e.g., 100 kHz) may have harmonic components at integer multiples of switching frequency $f_{SW}$ 462 (e.g., 200 kHz, 300 kHz, 400 kHz, etc.). When multiple signals having switching frequency $f_{SW}$ 462 are out of phase from one another, adding the signals together may cause harmonic components of the signals at some integer multiples of switching frequency $f_{SW}$ 462 to add together (e.g., constructive interference) and harmonic components of the signals at other integer multiples of switching frequency $f_{SW}$ 462 to subtract from one another (e.g., destructive interference). For instance, adding a signal to a copy of itself which is out of phase by 180 degrees may constructively interfere at even integer multiples of the first frequency, and destructively interfere at odd integer multiples of switching frequency $f_{SW}$ 462. Likewise, adding three copies that are out of phase from one another by 120 degrees (e.g., 0 degrees, 120 degrees, and 240 degrees, etc.) may constructively interfere at integer multiples of three times switching frequency $f_{SW}$ 462 (e.g., 300 kHz, 600 kHz, etc.) and destructively interfere at all other integer multiples of the first frequency (e.g., 100 kHz, 200 kHz, 400 kHz, 500 kHz, etc.).

Figure 6A:
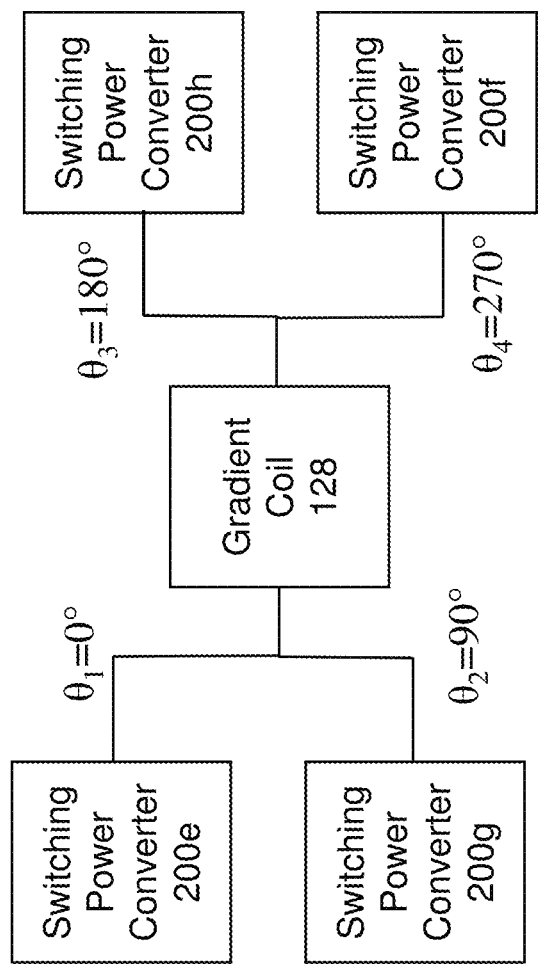
FIG. 6A shows an arrangement of four switching power converters driving a gradient coil.

FIG. 6A shows a differential or full-bridge configuration utilizing a 90 degree phase shift between converters connected in parallel and a 180 degree phase shift between the switching phases on opposite terminals of the gradient coil. Two switching power converters are coupled in parallel to drive one end of the gradient coil 128, with one switching power converter shifted in phase by 90 degrees with respect to the other converter. Two switching power converters are similarly connected in parallel and to the opposite end of the gradient coil 128, and driven out of phase 180 degrees with respect to their counterpart on the other end of the gradient coil.

Figure 6B:
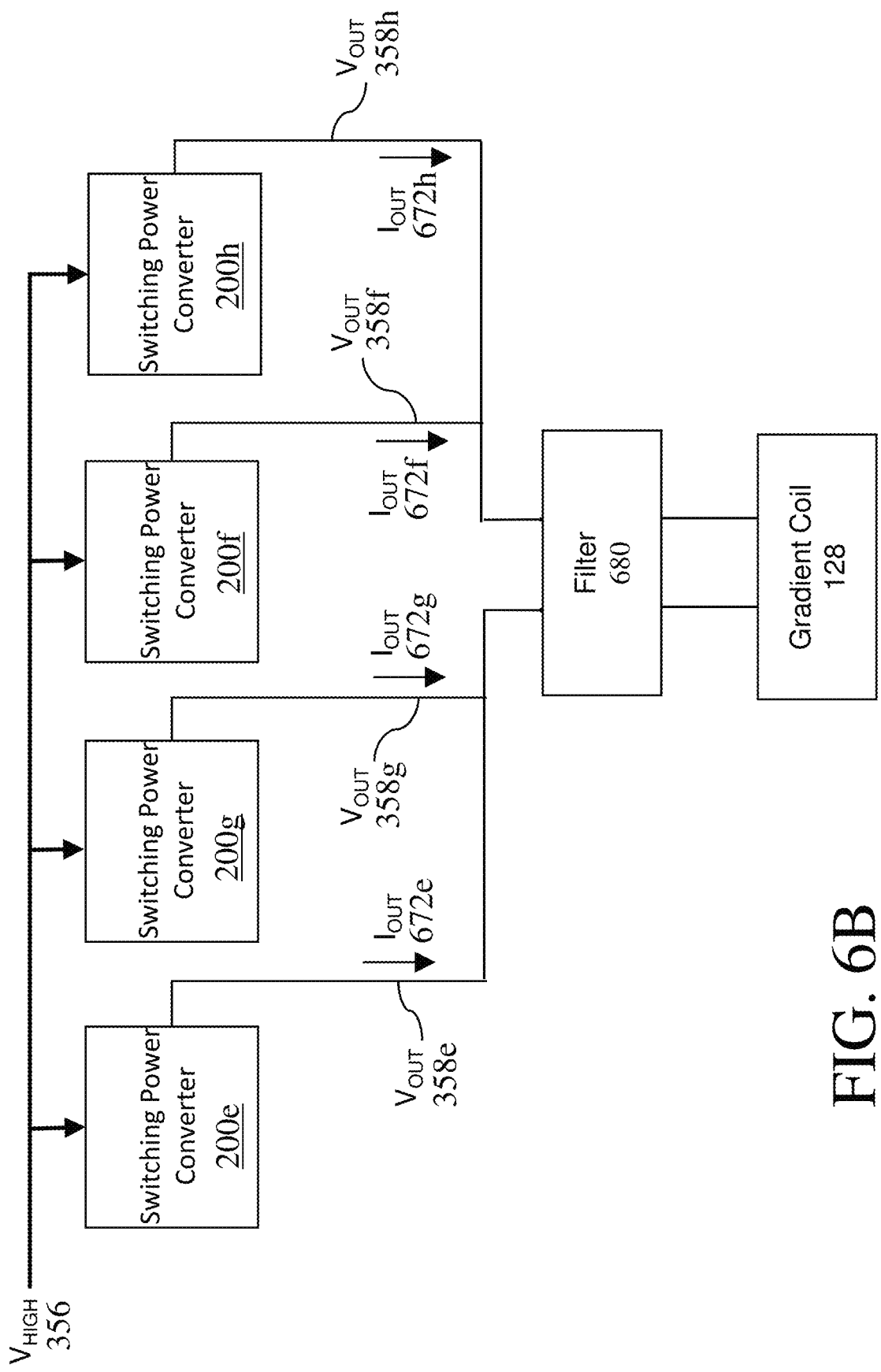
FIG. 6B is a block diagram illustrating multiple switching power converters according to FIG. 6A, with currents and voltages labeled.

FIG. 6B is a block diagram illustrating switching power converters 200e-200h, having a configuration similar to that of FIG. 6A, in accordance with some embodiments. Switching power converters 200e-200h are configured to provide output signals $V_{OUT}$ 358e-358h and output currents $I_{OUT}$ 672e-672h, respectively, to filter 680 for powering gradient coil 128. Filter 680 may include one or more tank circuits, as discussed above with reference to FIG. 5B. It should be appreciated that, in some embodiments, the switching power converters may provide output signals $V_{OUT}$ 358e-358h to filter 680, and generate output currents $I_{OUT}$ 672e-672h for gradient coil 128.

Switching power converters 200e-200h may be configured in the manner described in connection with FIGS. 3A-3B. Further, switching power converters 200e-200h may respectively provide output signals $V_{OUT}$ 358e-358h. For instance, output signals $V_{OUT}$ 358e-358h may have switching frequency $f_{SW}$, and may be 90 degrees out of phase from one another. As an example, output signal $V_{OUT}$ 358e may be 180 degrees out of phase from output signal $V_{OUT}$ 358f, and may be 90 degrees out of phase from output signal $V_{OUT}$ 358g. As shown in FIG. 6B, output signal $V_{OUT}$ 358e is provided to a first terminal of gradient coil 128 and output signal $V_{OUT}$ 358f is provided to a second terminal of gradient coil 128. For example, each of switching power converters 200e-h may have half bridge switching circuitry.

Output signals $V_{OUT}$ 358g and 358h may be out of phase from one another by 180 degrees, as described for output signals $V_{OUT}$ 358e and 358f. Moreover, because output signals $V_{OUT}$ 358e-358h may be 90 degrees out of phase from one another, output currents $I_{OUT}$ 672e-672h may combine to provide an output signal having a higher frequency than switching frequency $f_{SW}$, resulting in at least partial cancellation of switching noise at some integer multiples of switching frequency $f_{SW}$.

The inventor(s) have recognized that, because output current 672e and output current 672g may be generated separately (e.g., by switching power converters 200e and 200g, respectively) and fed at the same time to gradient coil 128, any imbalance between output current 672e and output current 672g may result in excessive losses (e.g., heat dissipation) in the switches and filters of the power converters. A similar issue may arise with parallel-connected switching power converters 200f and 200h). The inventor(s) have recognized that active current balancing circuitry (e.g., active current feedback sensing and/or correction) may complicate switching power converters 200a-200b.

To address this problem, the inventor(s) have developed techniques for passively balancing output currents 672e and 672g (e.g., without active current balancing circuitry). The inventor(s) recognized that imbalance between output currents 672e and 672g may result from imprecise switch timing of switches 354. To address this problem, a fully-digital, high-accuracy PWM controller may be used to produce the drive signals for the switches 354 with accurate timing (e.g., with timing resolution under 300 picoseconds). To take advantage of the high-accuracy PWM controller, switches 354 may include GaN HEMTs (not shown in FIG. 6B, though shown in the embodiment of FIG. 5B), which are capable of switching very quickly and precisely, such that timing among switches 354 may have low variation. The combination of a high-accuracy PWM controller and fast, accurate switches allows for the duty cycles of the switching power converters to be equal to each other within a high degree of precision, which ensures their output currents are equal within a high degree of precision. Accordingly, output currents $I_{OUT}$ 672e-672g may be passively balanced without the need for active current balancing via extra feedback loops or passive balancing via added series resistance with each power converter.

In some embodiments, switching power converters 200 may be located on a same printed circuit board (PCB), which may help to ensure that the output voltage of each power converter is equal. Further, having the switching power converters 200 on the same PCB may help avoid signal skew (e.g., due to parasitics) reducing the effectiveness of ripple cancellation.

Figure 6C:
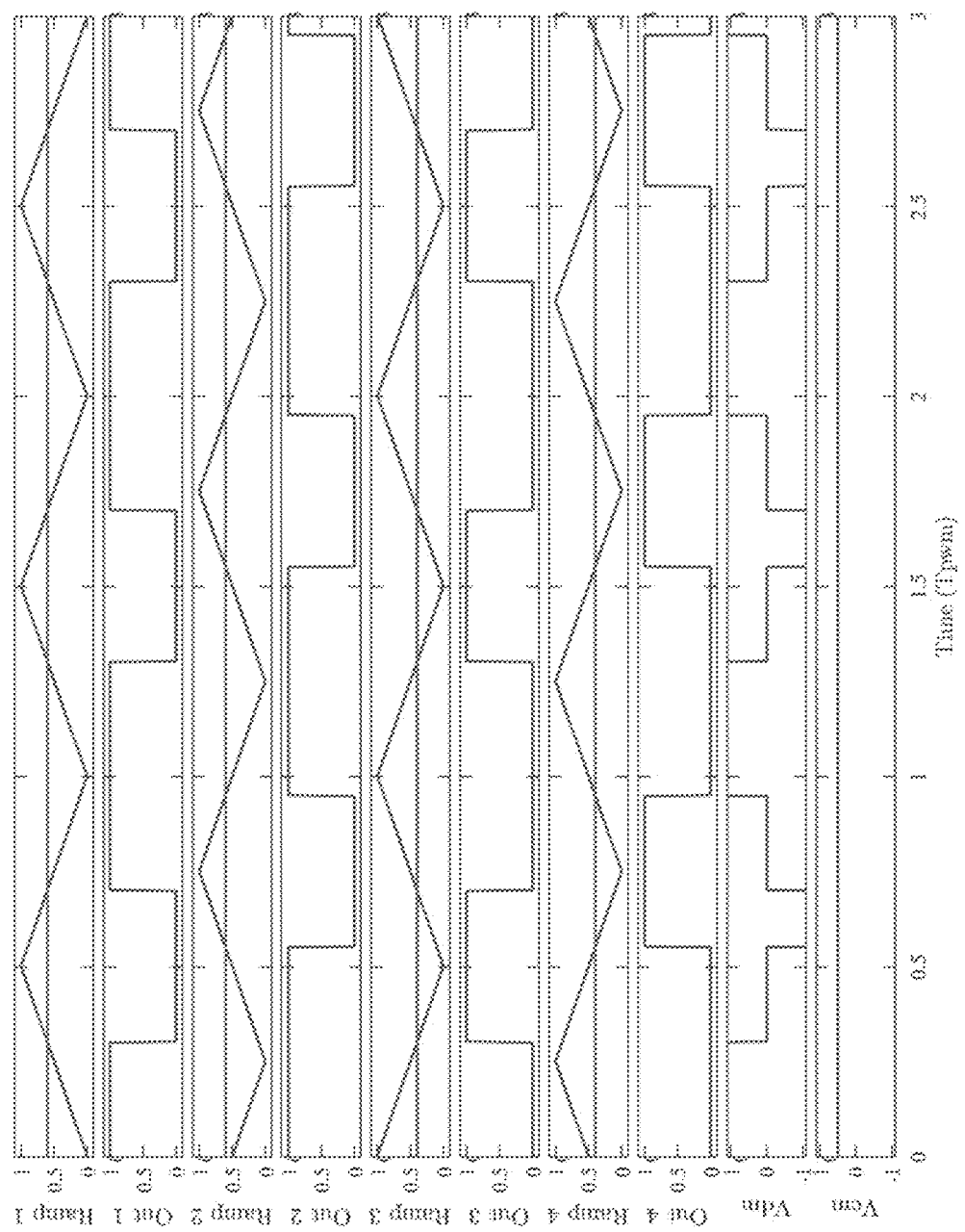
FIG. 6C shows a timing diagram illustrating signals corresponding to the switching power converters of FIGS. 6A and 6B, with the same phases shown in FIG. 6A.

FIG. 6C shows a timing diagram illustrating signals corresponding to the switching power converters of FIGS. 6A and 6B, with the same phases shown in FIG. 6A. The switching power converters have the same switching frequency. Converters 200e and 200g drive one side of the gradient coil 128 in parallel with a duty cycle D=0.6. Converters 200f and 200h drive the other side of the gradient coil 128 with complementary duty cycle D'=0.4. Ramp 1 is $V_{RAMP}$ for power converter 200e and Out 1 is Vout 358g for power converter 200e. Ramp 2 is $V_{RAMP}$ for power converter 200g and Out 2 is Vout 358g for power converter 200g. Ramp 3 is $V_{RAMP}$ for power converter 200f and Out 3 is Vout 358f for power converter 200f. Ramp 4 is $V_{RAMP}$ for power converter 200h and Out 4 is Vout 358h for power converter 200h. A threshold used for comparison with each ramp signal is also shown. Vdm is the differential mode voltage across the gradient coil 128. Vcm is the common mode voltage, which is the average of the outputs of the four power converters. All voltages are normalized in FIG. 6C. As can be seen, Vcm is constant, and therefore does not produce interference at frequencies of interest. However, Vdm has a fundamental component double the switching frequency of the switching power converters 200e-200h. As defined above, since the gradient coil is driven differentially, the characteristic frequency is the fundamental component of Vdm, which in this case is double the switching frequency.

Figure 6D:
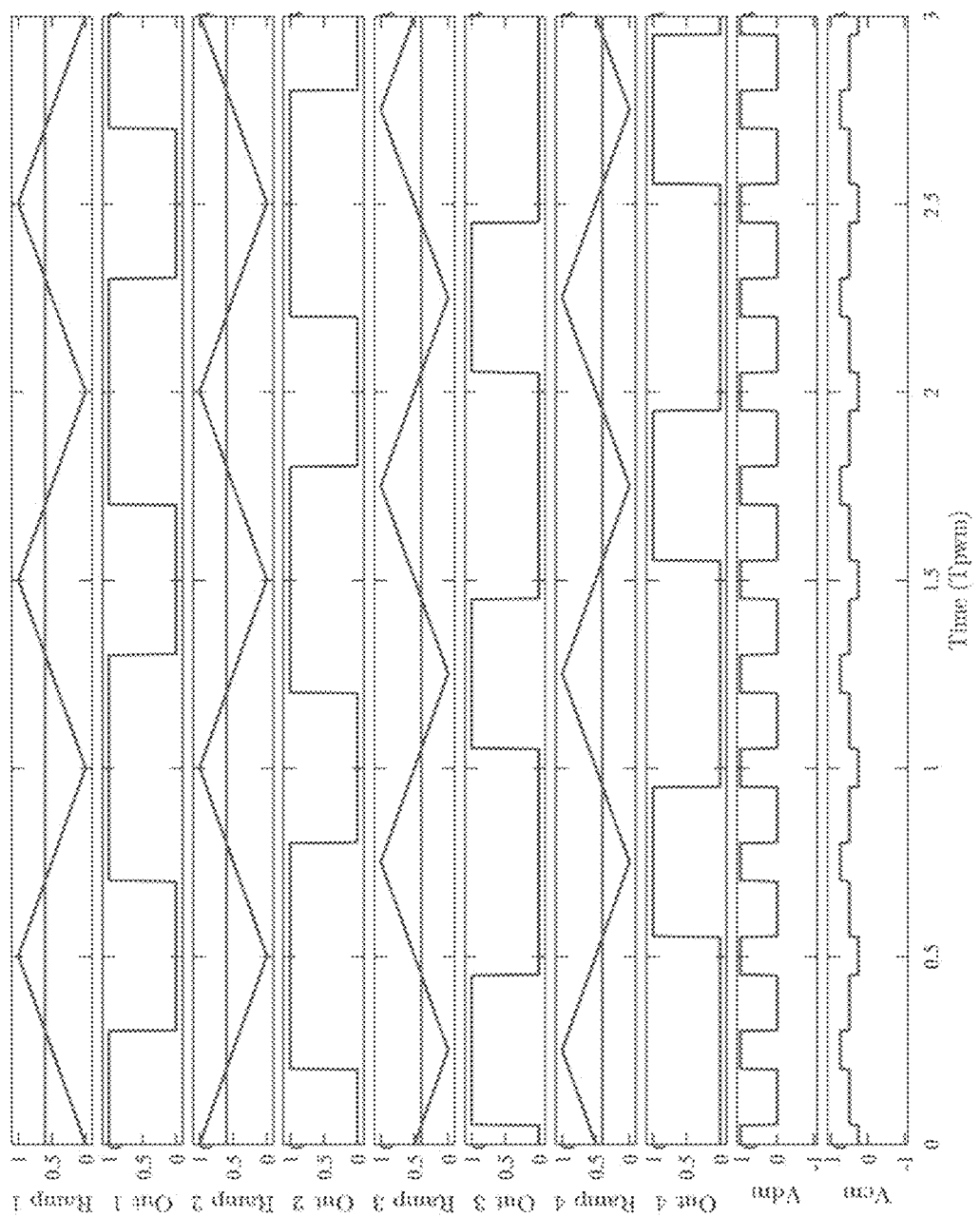
FIG. 6D shows a timing diagram illustrating signals corresponding to the switching power converters of FIGS. 6A and 6B, with different phases.

FIG. 6D shows a timing diagram illustrating signals corresponding to the switching power converters of FIGS. 6A and 6B, with different phases ($\theta 1=0$, $\theta 2=180$, $\theta 3=90$, $\theta 4=270$). The switching power converters have the same switching frequency. Converters 200e and 200g drive one side of the gradient coil with 180 degree phase shifts with respect to one another. Converters 200f and 200h drive the other side of the gradient coil 128 with 180 degree phase shifts with respect to one another, and 90 degrees phase shifted with respect to the outputs of converters 200e and 200g. Ramp 1 is $V_{RAMP}$ for power converter 200e and Out 1 is Vout 358g for power converter 200e. Ramp 2 is $V_{RAMP}$ for power converter 200g and Out 2 is Vout 358g for power converter 200g. Ramp 3 is $V_{RAMP}$ for power converter 200f and Out 3 is Vout 358f for power converter 200f. Ramp 4 is $V_{RAMP}$ for power converter 200h and Out 4 is Vout 358h for power converter 200h. A threshold used for comparison with each ramp signal is also shown. Vdm is the differential mode voltage across the gradient coil 128. Vcm is the common mode voltage, which is the average of the outputs of the four power converters. All voltages are normalized in FIG. 6D. Vcm has common mode frequency components which can be rejected (e.g., with a common-mode choke). However Vdm has a fundamental component at four times the switching frequency of the switching power converters 200e-200h. As defined above, since the gradient coil is driven differentially, the characteristic frequency is the fundamental component of Vdm, which in this case is four times the switching frequency.

Figure 7:
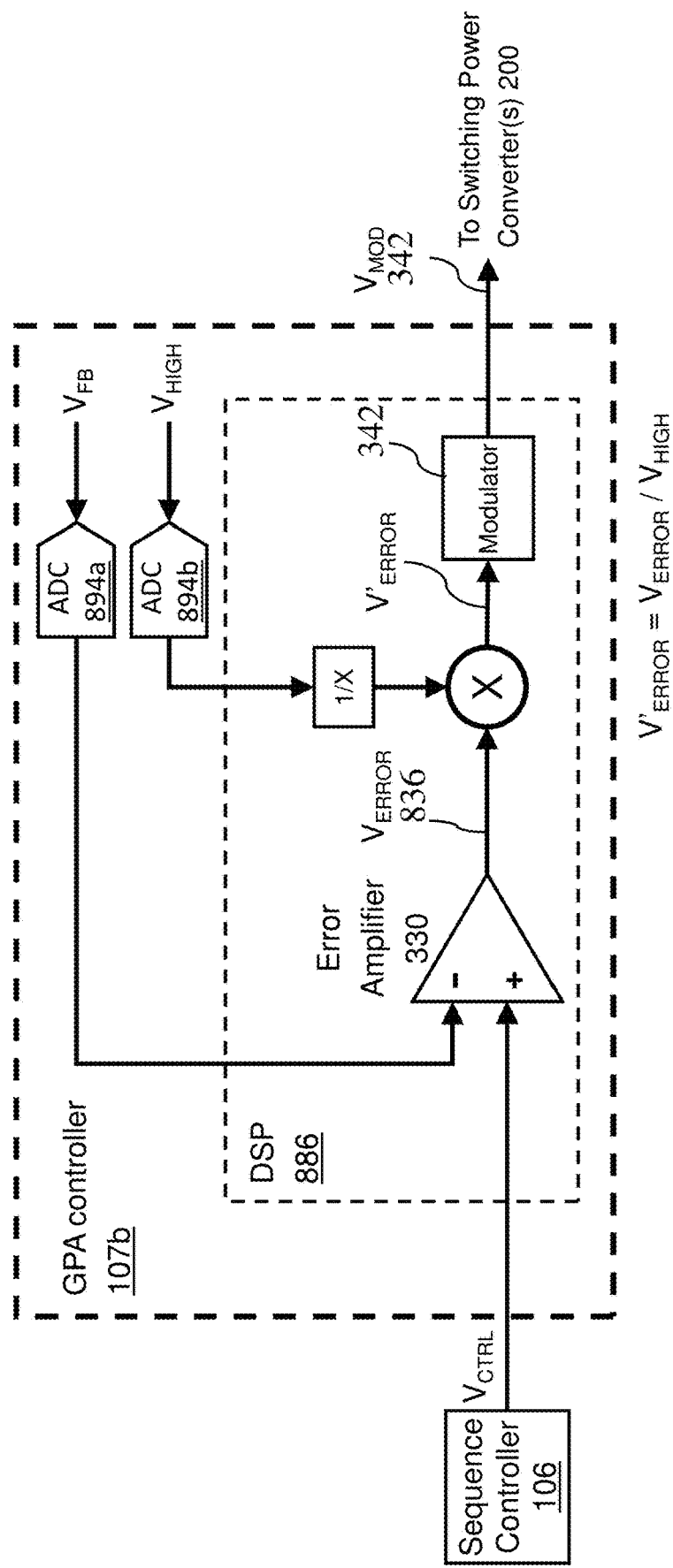
FIG. 7 is a block diagram of a GPA controller, in accordance with some embodiments.

FIG. 7 is a block diagram of one example of a GPA controller 107b for controlling the switching power converters illustrating more detail than shown in FIG. 3B, in accordance with some embodiments. GPA controller 106 may receive a control voltage $V_{CTRL}$ from sequence controller 106. GPA controller 106 may include a digital signal processing (DSP) module 886 and ADCs 894a and 894b. 894a and 894b digitize $V_{FB}$ and $V_{HIGH}$, respectively, and provide digitized versions thereof to the DSP module 886. DSP module 886 may include an error amplifier 330 (e.g., an Op-Amp) that produces an error voltage signal $V_{ERROR}$ representing the difference between $V_{CTRL}$ and $V_{FB}$, as discussed above with respect to FIG. 3B. The DSP module 886 may divide $V_{ERROR}$ by $V_{HIGH}$ (as represented in FIG. 7 by the 1/X block and multiplier) to produce signal $V'_{ERROR}$, which is equal to $V_{ERROR}/V_{HIGH}$. The modulator 342 is a digital modulator that receives $V'_{ERROR}$ and produces the modulated signal $V_{MOD}$ 342 to control the switching power converters, as discussed above with respect to FIG. 3B.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. An apparatus for providing power to operate at least one gradient coil of a magnetic resonance imaging system, the apparatus comprising:
   at least one switching power converter configured to provide, to the at least one gradient coil, an output signal having a characteristic frequency,
   wherein a Larmor frequency associated with a $B_0$ field strength of the magnetic resonance imaging system is between adjacent positive integer multiples of the characteristic frequency.

2. The apparatus of claim 1, wherein the Larmor frequency is greater than the characteristic frequency and less than twice the characteristic frequency.

3. The apparatus of claim 1, wherein the Larmor frequency is greater than twice the characteristic frequency and less than three times the characteristic frequency.

4. The apparatus of claim 1, wherein the output signal comprises a direct current (DC) component and an alternating current (AC) ripple component, and wherein the characteristic frequency is a frequency of the AC ripple component.

5. The apparatus of claim 4, wherein the at least one switching converter is configured to differentially drive the at least one gradient coil, and the frequency of the AC ripple component is a differential mode component of the AC ripple component.

6. The apparatus of claim 1, wherein the at least one switching power converter comprises a plurality of switching power converters.

7. The apparatus of claim 6, wherein at least a first power converter of the plurality of switching power converters has a switching frequency below the characteristic frequency and greater than zero.

8. The apparatus of claim 7, wherein the characteristic frequency is a positive integer multiple of the switching frequency.

9. The apparatus of claim 6, wherein the plurality of switching power converters is configured to switch such that a plurality of output signals of the plurality of switching power converters have frequency components that destructively interfere with one another.

10. The apparatus of claim 6, wherein at least two switching power converters of the plurality of switching power converters are coupled in parallel.

11. The apparatus of claim 6, wherein at least two switching power converters of the plurality of switching power converters are configured to switch out of phase from one another.

12. The apparatus of claim 11, wherein:
   the plurality of switching power converters comprises first and second switching power converters coupled in parallel and configured to switch 90 degrees out of phase from one another, and
   the first and second switching power converters are configured to switch at a second frequency that is half of the characteristic frequency.

13. The apparatus of claim 1, wherein the at least one switching power converter comprises at least one gallium nitride transistor.

14. The apparatus of claim 13, wherein the at least one switching power converter comprises a high-side transistor coupled between the at least one gradient coil and a first power terminal and a low-side transistor coupled between the at least one gradient coil and a second power terminal.

15. A magnetic resonance imaging system, comprising:
   a $B_0$ magnet configured to produce a $B_0$ magnetic field having an associated Larmor frequency;
   at least one gradient coil; and
   at least one switching power converter configured to provide, to the at least one gradient coil, an output signal having a characteristic frequency,
   wherein the Larmor frequency is between adjacent positive integer multiples of the characteristic frequency.

16. A method for providing power to operate at least one gradient coil of a magnetic resonance imaging system, the method comprising:
   providing, to the at least one gradient coil, by at least one switching power converter, an output signal having a characteristic frequency, such that a Larmor frequency associated with a $B_0$ field strength of the magnetic resonance imaging system is between adjacent positive integer multiples of the characteristic frequency.

17. An apparatus for providing power to operate at least one gradient coil of a magnetic resonance imaging system, the apparatus comprising:
   a first switching power converter configured to provide a first current to a first gradient coil of the at least one gradient coil; and
   a second switching power converter configured to provide a second current to the first gradient coil,
   wherein the first and second currents are balanced without any current-balancing circuitry.

18. The apparatus of claim 17, wherein the first and second switching power converters are coupled in parallel.

19. The apparatus of claim 17, wherein the first and second switching power converters are half bridges.

20. The apparatus of claim 17, wherein the first and second switching power converters each comprise gallium nitride transistors.

21. The apparatus of claim 17, wherein the first and second currents differ from one another in magnitude by less than 20% of a maximum output current of the first switching power converter.

22. A magnetic resonance imaging system, comprising:
   a $B_0$ magnet;

at least one radio frequency (RF) coil configured to transmit and/or receive magnetic resonance signals;
at least one gradient coil;
a first switching power converter configured to provide a first current to a first gradient coil of the at least one gradient coil; and
a second switching power converter configured to provide a second current to the first gradient coil,
wherein the first and second currents are balanced without any current-balancing circuitry.

* * * * *